(12) United States Patent
Muff

(10) Patent No.: US 7,474,552 B2
(45) Date of Patent: Jan. 6, 2009

(54) INTEGRATED SEMICONDUCTOR MEMORY DEVICE

(75) Inventor: Simon Muff, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 22 days.

(21) Appl. No.: 11/370,172

(22) Filed: Mar. 8, 2006

(65) Prior Publication Data

US 2007/0211552 A1 Sep. 13, 2007

(51) Int. Cl.
*G11C 11/00* (2006.01)
(52) U.S. Cl. .................. 365/148; 365/225.7; 365/46; 365/207
(58) Field of Classification Search ............ 365/189.09, 365/225.7, 148
See application file for complete search history.

(56) References Cited

U.S. PATENT DOCUMENTS

2006/0133126 A1* 6/2006 Fujisawa et al. .............. 365/63

2007/0057723 A1* 3/2007 Pan et al. .................... 330/252

* cited by examiner

Primary Examiner—Hoai V Ho
Assistant Examiner—Jason Lappas
(74) Attorney, Agent, or Firm—Edell, Shapiro & Finnan, LLC

(57) ABSTRACT

An integrated semiconductor memory device comprises: a receiver circuit for receiving a data signal, a receiver circuit for receiving a command signal, and a receiver circuit for receiving an address signal. A programmable storage unit comprises programmable elements. A current of the receiver circuits is controlled in dependence on a state of the programmable elements of the programmable storage unit. Depending on the application in which the integrated semiconductor memory device is used, the current of the receiver circuits is increased or decreased. By decreasing the current of the receiver circuits a dissipation loss of the integrated semiconductor memory device is reduced.

18 Claims, 2 Drawing Sheets

INTEGRATED SEMICONDUCTOR MEMORY DEVICE

FIELD OF THE INVENTION

The invention relates to an integrated semiconductor memory device with a receiver circuit for receiving data signals, address signals and control signals. The invention also relates to a method for operating an integrated semiconductor memory device comprising a receiver circuit for receiving data signals, address signals and command signals.

BACKGROUND

Integrated semiconductor memory devices, such as DRAM (dynamic random access memory) devices, comprise a memory cell array with memory cells for storing data items. In order to store a data item in a memory cell of the memory cell array, a write command is applied to a control terminal of the integrated semiconductor memory device. Furthermore, to select one of the pluralities of memory cells which are arranged in rows and columns inside the memory cell array an address is applied to the integrated semiconductor memory device. The data item which has to be written into the selected memory cell is applied to a data terminal.

The semiconductor memory device comprises receiver circuits for receiving signals externally applied to the integrated semiconductor memory device. A first receiver circuit is connected to the control terminal for receiving the control signal. A second receiver circuit is connected to the address terminal to receive the address signal. A third receiver circuit is connected to the data terminal to receive the data signal. The receiver circuits are usually designed as differential amplifier circuits.

FIG. 1 illustrates an embodiment of a differential amplifier circuit used as a receiver circuit in an integrated semiconductor memory device. The receiver circuit comprises a terminal for applying a power supply voltage and a terminal for applying a reference voltage, such as a ground potential. First and second current paths are connected in parallel between the terminal for applying the power supply voltage and a common terminal. The first current path comprises a first transistor and a first resistor which are connected in series between the terminal for applying the power supply voltage and the common terminal. The second current path comprises a second transistor and a second resistor which are connected in series between the terminal for applying the power supply voltage and the common terminal. A common current path which comprises a current source connects the common terminal with the terminal for applying the reference voltage. The current source generates a constant bias current.

A control terminal of the first transistor is used to apply a reference signal. A control terminal of the second transistor serves to apply an input signal. When the receiver circuit illustrated in FIG. 1 is provided in an integrated semiconductor memory device as a data input receiver, data signals which are externally applied to the integrated semiconductor memory device are transferred to the control terminal of the second transistor of the receiver circuit. When the receiver circuit is provided for receiving address signals, an address signal, which is externally applied to the integrated semiconductor memory device, actuates the control terminal of the second transistor of the receiver circuit. It is also possible to provide the receiver circuit for receiving command signals externally applied to the integrated semiconductor memory device for activating a read access or a write access to the memory cells of the integrated semiconductor memory device. In this case, the control terminal of the second transistor of the receiver circuit is driven by a command signal.

A memory module, such as a DIMM (Dual In Line Memory Module), comprises a plurality of integrated semiconductor memory devices. A dissipation loss of the module is dependent on the number of integrated semiconductor memories of the memory module. Another contributor to dissipation losses is leakage currents which occur in each of the receiver circuits of the integrated semiconductor memory devices. A high amount of the bias current causes an increased dissipation loss. However, a high amount of bias current also enables a reduced access time for read accesses and write accesses as the receiver sensitivity is dependent on the amount of bias current.

The DIMM can be used in different application fields wherein the integrated semiconductor memory devices arranged on a surface of a chip of the DIMM have different organization forms. Integrated semiconductor memory devices for notebook applications are usually designed in an organization form ×16. In the organization form ×16, a common access, to sixteen individual memory cells, is performed during a unique read access or write access. Integrated semiconductor memory devices organized in a configuration ×8 are provided for desktop applications. In the desktop mode a common access to eight memory cells during a unique read access or write access is enabled. For server applications, integrated semiconductor memory devices with an organization form ×4 are provided. In the organization form ×4, a common access to four memory cells during a unique read access or write access is enabled.

For desktop applications as well as for notebook applications the access time is an important matter. For server applications an important performance feature of a module is the memory density, i.e., the number of integrated semiconductor memory devices arranged on a chip of the module.

Up until now, the receiver circuits of integrated semiconductor memory devices have been designed to afford a high speed access to the memory cells. That means that the current source is designed to generate a high amount of bias current. As a consequence, when integrated semiconductor memory devices comprising receiver circuits that are configured as differential amplifier circuits such as shown in FIG. 1 and are operated with a high amount of bias current, a high dissipation loss occurs. High density semiconductor memory modules with a memory capacity of 4, 8 or 16 Gigabyte have a dissipation loss or a thermal design power of 10 Watt or more.

The high dissipation loss leads to a high temperature of the memory module. To decrease the high temperature of the module it is required to arrange a plurality of fans on the chip of the memory module. Another problem occurs if the memory cell array of the integrated semiconductor memory device comprises DRAM cells. For a memory module comprising such memory cells, the high temperature leads to retention problems.

Therefore, it is desired to decrease the high temperature of the integrated semiconductor memory device or the memory module. A further possibility to reduce the high temperature is to decrease the clock frequency of the memory module. However, the reduction of clock frequency as well as the use of ventilators leads to a deterioration of the cost/performance ratio of the integrated semiconductor memory devices or the memory module including such integrated semiconductor memory devices.

SUMMARY

The invention reduces the dissipation loss of an integrated semiconductor memory device. In addition, the invention specifies a method for operating an integrated semiconductor memory device with a reduced dissipation loss.

According to an exemplary embodiment of the invention, an integrated semiconductor memory device comprises: a programmable storage unit for storing a storage state, a receiver circuit comprising a first terminal for applying a power supply voltage, a second terminal for applying a reference voltage, a third terminal, a first current path, a second current path and a controllable resistor. The first current path and the second current path of the receiver circuit are connected in parallel between the first terminal and the third terminal of the receiver circuit. The controllable resistor of the receiver circuit is connected between the third terminal and the second terminal of the receiver circuit. A resistance of the controllable resistor of the receiver circuit is dependent on the storage state.

In a further embodiment of the integrated semiconductor memory device the controllable resistor is designed as a transistor.

In a variant embodiment of the integrated semiconductor memory device the semiconductor memory device comprises an evaluation unit for generating a control signal. The evaluation unit is connected to the programmable storage unit for evaluating the storage state of the programmable storage unit. The evaluation unit is designed to generate a state of the control signal in dependence on the storage state of the programmable storage unit.

According to another design of the integrated semiconductor memory device the controllable resistor comprises a control terminal for applying a control signal. The control signal is applied to the control terminal of the controllable resistor, where the resistance value of the resistor is dependent on a state of the control signal.

In a further embodiment of the integrated semiconductor memory device the programmable storage unit comprises a programming terminal for applying a programming signal and a programmable element for storing the storage state. The programmable storage unit is designed such that the storage state is programmed in the programmable element in dependence on the programming signal.

According to invention the programmable element of the programmable storage unit is designed as an electrical fuse which is programmable by applying the programming signal to the programming terminal of the programmable storage unit, wherein the programmable element of the programmable storage unit is designed as a laser fuse which is programmable by a laser light.

In another embodiment of the integrated semiconductor memory device the receiver circuit comprises: a first transistor arranged in the first current path comprising a control terminal for applying a reference signal, and a second transistor arranged in the second current path comprising: a control terminal for applying an input signal, and an output terminal for generating an output signal in dependence on a state of the input signal and a state of the reference signal.

In another refined design of the integrated semiconductor memory device, a memory cell array comprising: memory cells for storing data items, a terminal for applying a data signal, a terminal for applying an address signal, and a terminal for applying a control signal. At least one of the memory cells is selectable for a read access/write access in dependence on the address signal. At least one of the data items is stored in one of the memory cells in dependence on the data signal.

According to a further design of the integrated semiconductor memory device the control terminal of the second transistor of the receiver circuit is connected to the terminal for applying the data signal. The output signal of the receiver circuit is transmitted to the memory cell array.

According to another embodiment of the invention the integrated semiconductor memory device comprises an address register for storing a state of the address signal. The control terminal of the second transistor of the receiver circuit is connected to the terminal for applying the address signal. The output signal of the receiver circuit is transmitted to the address register.

In another embodiment of the invention, the integrated semiconductor memory device comprises a control unit for controlling the read access/write access in dependence on a state of the control signal. The control terminal of the second transistor of the receiver circuit is connected to the terminal for applying the control signal. The output signal of the receiver circuit is transmitted to the control unit.

In a preferred embodiment of the integrated semiconductor memory device each of the memory cells is designed as a random access memory cell.

According to another preferred embodiment of the invention, the semiconductor memory device is provided as a memory component of a Dual-In-Line-Memory module.

The method for operating the integrated semiconductor memory device is achieved by providing a semiconductor memory device comprising a programmable storage unit with a programmable element, in which a storage state may be stored and a receiver circuit for receiving a data signal, an address signal or a control signal comprising a first terminal for applying a power supply voltage, a second terminal for applying a reference voltage, a third terminal, a first current path, a second current path, and a controllable resistor, wherein the first current path and the second current path of the receiver circuit are connected parallel between the first terminal and the third terminal of the receiver circuit, and wherein the controllable resistor of the receiver circuit is connected between the third terminal and the second terminal of the receiver circuit. The storage state of the programmable element of the programmable storage unit is evaluated. A resistance of the controllable resistor of the receiver circuit is increased when a first storage state of the programmable element of the programmable storage unit was evaluated. Alternatively, the resistance of the controllable resistor of the receiver circuit is decreased when a second storage state of the programmable element of the programmable storage unit was evaluated.

BRIEF DESCRIPTION OF THE DRAWINGS

The invention is explained in more detail below with reference to figures which show exemplary embodiments of the invention and in which.

DETAILED DESCRIPTION

For integrated semiconductor memory devices which are used for desktop or notebook applications, it is required to have a short access time for read or write operations. Therefore, receiver circuits of integrated semiconductor memory devices used for desktop or notebook applications comprising differential amplifiers configured to generate a high amount of bias current. However, in the server application segment customers are less interested in speed, but are more interested in a high density of a memory module. For server applications, it is possible to reduce the dissipation loss and the power consumption by decreasing bias current of the differential amplifiers which are used as receiver circuits for data signals, address signals or command signals. The invention provides an integrated semiconductor memory device comprising receiver circuits built as differential amplifiers wherein the current source of the receiver circuit is designed such that the generated bias current is variable.

Figure 1:
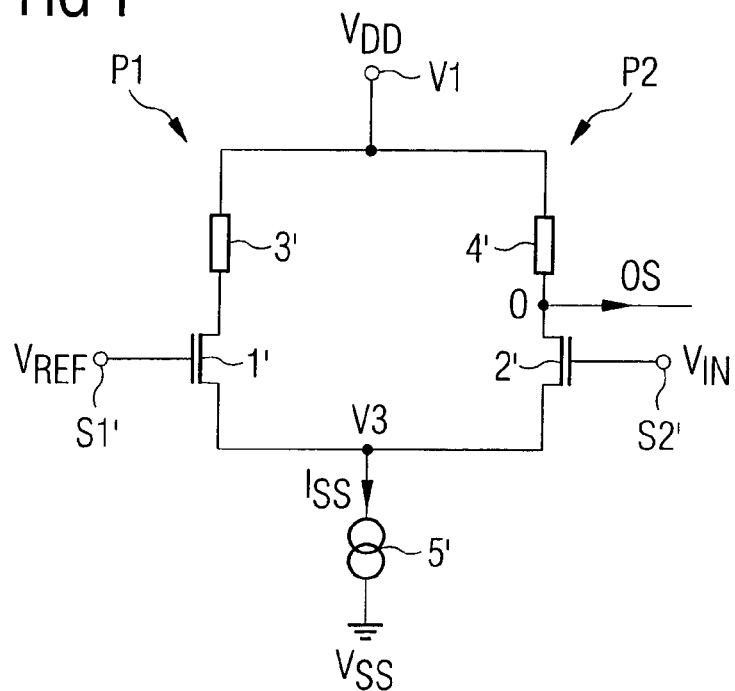
FIG. 1 shows a receiver circuit used in integrated semiconductor memory devices for receiving data, address and command signals.
Figure 2:
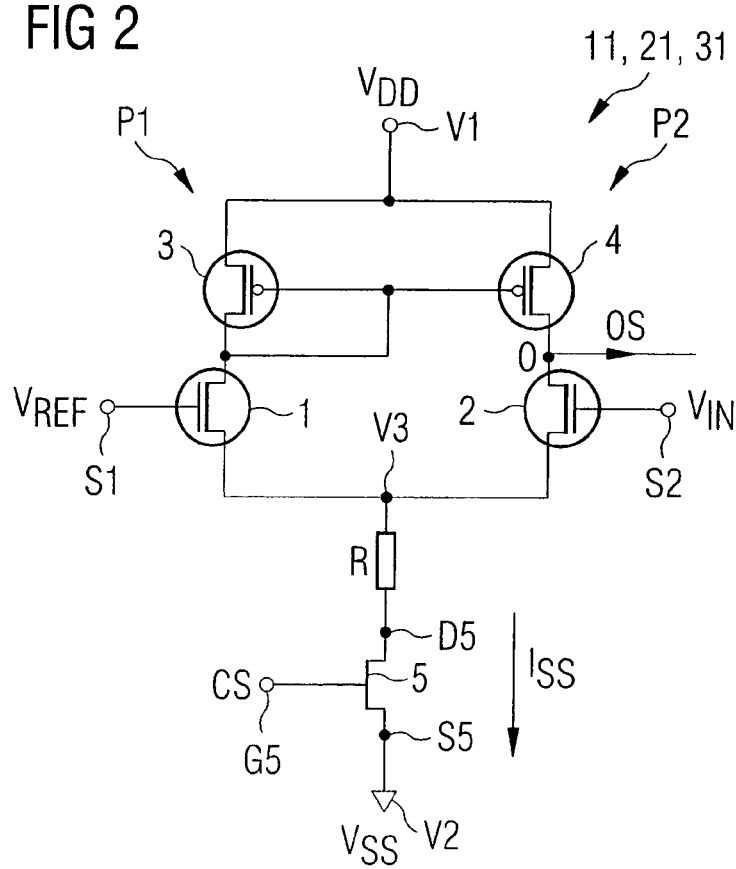
FIG. 2 shows an embodiment of an integrated semiconductor memory device comprising receiver circuits having a reduced dissipation loss.

FIG. 2 shows an integrated semiconductor memory device with the ability to generate different amounts of bias current in the receiver circuits of the memory device. The integrated semiconductor memory device comprises a memory cell array. Memory cells are arranged in rows and columns within the memory cell array. If the memory cell array includes DRAM-memory cells, each of the memory cells comprises a selection transistor and a capacitor which are connected in series between a bit line and a terminal for applying a reference potential. A gate terminal of the selection transistor is connected to a word line. A memory cell is activated for a read/write access by generating a high potential on the word line which turns on the selection transistor. By supplying the word line with a low potential, the selection transistor is turned off and the memory cells which are arranged along the word line are deactivated.

Furthermore, the integrated semiconductor memory device comprises a terminal for applying a power supply voltage and a terminal for applying a reference voltage. A control terminal is provided to apply a command signal. An address terminal is used to apply an address signal. Data signals are applied to a data terminal.

For a write access a state of the command signal characterizing the write access is applied to the command terminal. The command terminal is connected to a receiver circuit for receiving the command signal. The receiver circuit amplifies the received command signal and transfers an amplified output signal to a control circuit. The control circuit evaluates the amplified output signal of the receiver circuit and controls a read access or a write access to one of the memory cells of the memory cell array.

For selecting one of the memory cells for a read access or a write access the address signal is applied to the address terminal. The address terminal is connected to a receiver circuit which receives the address signal and generates an amplified output signal in dependence on the address signal. The amplified output signal of the receiver circuit is transferred to an address register. A column address decoder and a row address decoder are connected to the address register. The row address decoder selects one of the worldliness in the memory cell array which depends on a column address signal which is stored in address register. The column address decoder selects one of the bit lines of the memory cell array in dependence on a column address signal which is stored in the address register.

A receiver circuit is connected to the data terminal for receiving data signals. The receiver circuit amplifies the received data signal and actuates the memory cell array with the amplified output data signal in dependence on the received data signal. The amplified data signal is stored as a data item in one of the memory cells.

Figure 3:
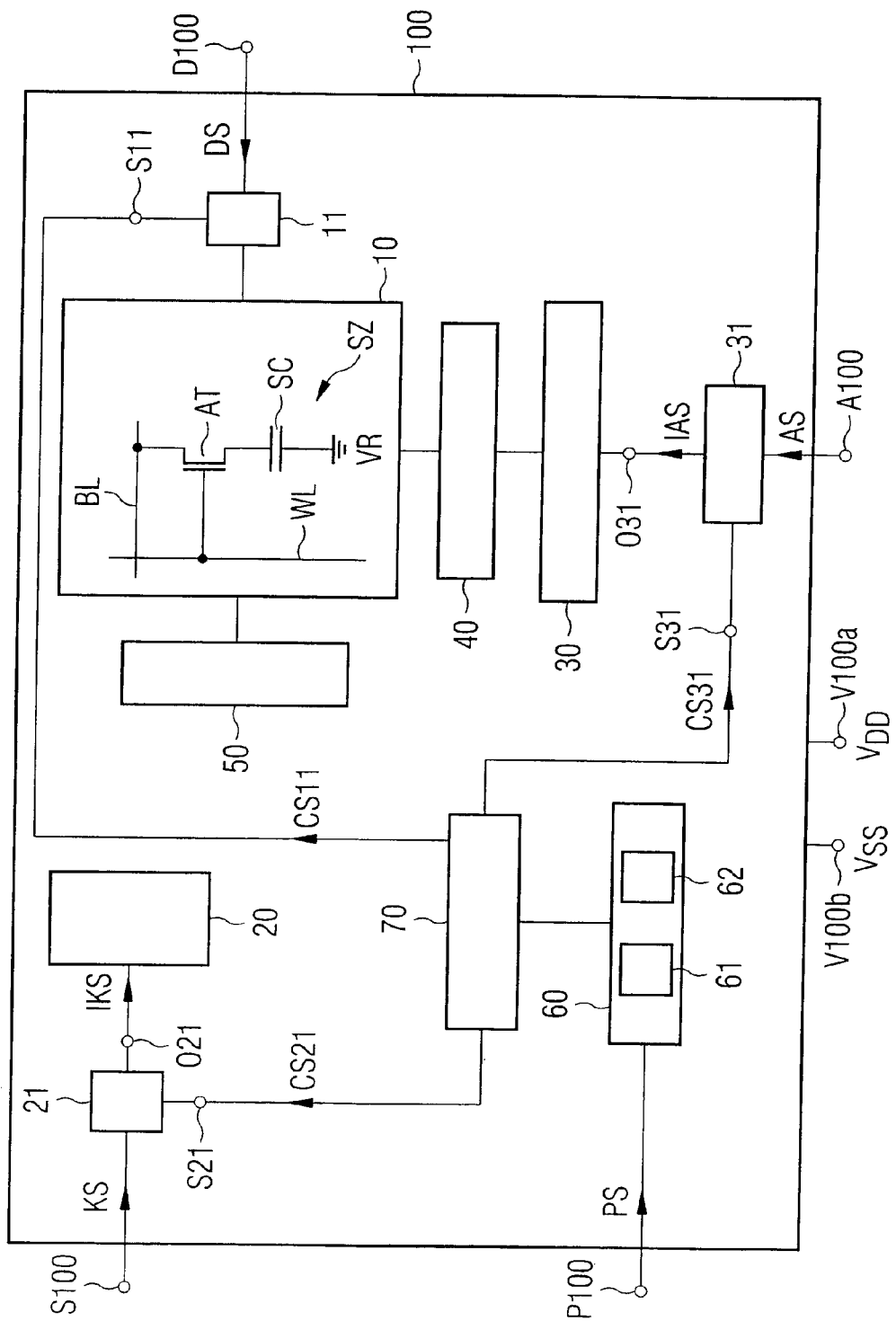
FIG. 3 shows an embodiment of a receiver circuit used in an integrated semiconductor memory device for reducing a dissipation loss.

FIG. 3 shows an embodiment of the receiver circuits. Each of the receiver circuits comprises a terminal for applying a power supply voltage and a terminal for applying a reference voltage. A first input transistor is arranged in a first current path. A control terminal of input transistor is actuated by a control signal. A second current path comprises a second transistor with a control terminal for applying an input signal. If the receiver circuit is used as data signal receiver circuit, the control terminal is driven by the data signal. If the receiver circuit is used as command signal receiver circuit, the control terminal is driven by the command signal. If the receiver circuit is used as address signal receiver circuit, the control terminal is driven by the address signal. In the embodiment shown in FIG. 2 first and second transistors are designed as n-channel field effect transistors.

A third transistor which is designed as a p-channel field effect transistor is connected between terminal for applying the power supply voltage and a drain terminal of the field effect transistor. A fourth transistor which is designed as a p-channel field effect transistor is connected between terminal for applying the power supply voltage and an output terminal for generating an output signal. The data signal receiver circuit generates an amplified data signal and from its output terminal transfers the data signal to the memory cell array. The control signal receiver circuit generates an amplified internal command signal and from its output terminal transfers the command signal to the control circuit. The address signal receiver circuit generates an amplified address signal and from its output terminal transfers the address signal to the address register.

A common terminal is connected via a resistor and a controllable resistor to terminal for applying the reference voltage. The controllable resistor is designed as a transistor with a control terminal for applying a control signal.

The resistance of controllable resistor is controlled by a state of the control signal. If the control signal has a first state, the transistor, of the controllable current path, is controlled such that a controllable current path between a drain terminal and a source terminal has a high resistance. As a result, the bias current in the receiver circuit is reduced. If the control terminal of transistor, of the controllable current path, is driven by a second state of control signal the transistor, of the controllable current path, has a low resistance. As a consequence, the bias current is increased.

In the following, the generation of the control signal is described according to FIG. 2. As illustrated in FIG. 2, the integrated semiconductor memory comprises a programmable storage unit. The programmable storage unit comprises programmable elements built as an electrical fuse or as a laser fuse. If the programmable storage unit is provided with electrical fuses the programmable storage unit is connected to a programming terminal for applying a programming signal. Depending on a state of the programming signal the state of the electrical fuse is programmed. If the programmable storage unit comprises laser fuses, each of the laser fuses is programmed by laser light during a manufacturing procedure of the integrated semiconductor memory device.

The state of the programmable elements of the programmable storage unit is evaluated by an evaluation circuit. Depending on the evaluated state of the electrical fuses or on the evaluated state of the laser fuses the evaluation unit generates a control signal. Control signals are generated by the evaluation unit, in order to drive the respective receiver circuits, and are transferred to the respective transistor control terminals of the controllable current paths, as illustrated in FIG. 3, of the respective receiver circuit. The programmable elements of the storage unit are programmed when the semiconductor memory device is tested in the front-end manufacturing line, e.g., during a test of the semiconductor chips which are mounted on a wafer. If the integrated semiconductor memory device is used as a memory component of a memory module, such as a DIMM, in a server application the programmable elements of the storage unit are programmed such that the transistors, of the controllable current paths of the data signal receiver circuit and/or the command signal receiver circuit and/or the address signal receiver circuit, are operated with a higher resistance value than in the case if the integrated semiconductor memory device is provided as a memory component used in a desktop application or notebook application. In this case the dissipation loss of the integrated semiconductor memory device is reduced.

If the integrated semiconductor memory device is used as a memory component of a DIMM in a desktop or notebook application, the programmable elements of the programmable storage unit are programmed such that transistors, of the controllable current paths of the data signal receiver circuit and/or the command signal receiver circuit and/or the address signal receiver circuit, are operated with a lower resistance value than in the case if the integrated semiconductor memory device is used as a memory component of a DIMM provided in a server application. Due to the lower resistance value of the controllable resistor, the bias current and the access time of the integrated semiconductor memory device is increased.

The integrated semiconductor memory device of the invention is able to adjust the bias current depending on the application in which the integrated semiconductor memory device is used. The dissipation loss caused by the bias current is reduced if an increased access time is acceptable for the application of the integrated semiconductor memory device.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 10 memory cell array
11 receiver circuit for data signal
20 control circuit
21 receiver circuit for command signal
30 address register
31 receiver circuit for address signal
40 column address decoder
50 row address decoder
60 programmable storage unit
61 electrical fuse
62 laser fuse
70 evaluation unit
AS address signal
CS control signal
DS data signal
ISS current of receiver circuit
KS command signal
OS output signal
S control terminal
VDD power supply voltage
VSS reference voltage

What is claimed is:

1. An integrated circuit comprising a memory device, the memory device comprising:
    a programmable storage unit for storing a storage state; and
    a receiver circuit comprising a first terminal for applying a power supply voltage, a second terminal for applying a reference voltage, a third terminal, a first current path, a second current path and a controllable resistor, wherein:
    the first current path of the receiver circuit includes a first transistor having a control terminal and the second current path of the receiver circuit includes a second transistor having a control terminal and the first and second current paths are connected in parallel between the first terminal and the third terminal of the receiver circuit;
    the controllable resistor of the receiver circuit is connected between the third terminal and the second terminal of the receiver circuit;
    a resistance value of the controllable resistor of the receiver circuit is dependent on the storage state, wherein the storage state indicates one of a high power dissipation or a low power dissipation and the resistance value of the controllable resistor is selected to have a first resistance value or a second resistance value that is lower than the first resistance value in response to the storage state; and
    the first and second transistors respectively are connected to the second terminal for applying the reference voltage via the controllable resistor,
    wherein the control terminal of the first transistor is actuated by a first signal, the control terminal of the second transistor is actuated by a second signal that is different from the first signal, and the control terminal of the first transistor and the control terminal of the second transistor are separated from each other.

2. The integrated circuit according to claim 1, wherein the controllable resistor comprises a transistor.

3. The integrated circuit according to claim 1, further comprising an evaluation unit for generating a control signal,
    wherein the evaluation unit is connected to the programmable storage unit for evaluating the storage state of the programmable storage unit, and
    wherein the evaluation unit is designed to generate a state of the control signal, depending on the storage state of the programmable storage unit.

4. The integrated circuit according to claim 1, wherein:
    the controllable resistor comprises a control terminal for applying a control signal;
    the control signal is applied to the control terminal of the controllable resistor; and
    the resistance value of the resistor is dependent on a state of the control signal.

5. The integrated circuit according to claim 1, wherein:
    the programmable storage unit comprises a programming terminal for applying a programming signal and a programmable element for storing the storage state, and
    the programmable storage unit is designed such that the storage state is programmed in the programmable element in dependence on the programming signal.

6. The integrated circuit according to claim 5,
wherein the programmable element of the programmable storage unit comprises an electrical fuse that is programmable by applying the programming signal to the programming terminal of the programmable storage unit.

7. The integrated circuit according to claim 5,
wherein the programmable element of the programmable storage unit comprises a laser fuse which is programmable by a laser light.

8. The integrated circuit according to claim 1,
wherein the control terminal of the first transistor is arranged to receive a reference signal and the control terminal of the second transistor is arranged to receive an input signal, and wherein the receiver circuit further comprises an output terminal for generating an output signal in dependence on a state of the input signal and a state of the reference signal.

9. The integrated circuit according to claim 8, further comprising:
a memory cell array which comprises memory cells for storing data items;
a first terminal for applying a data signal;
a second terminal for applying an address signal; and
a third terminal for applying a control signal,
wherein one of the memory cells is selectable for a read access/write access as a function of the address signal, and
wherein one of the data items is stored in one of the memory cells as a function of the data signal.

10. The integrated circuit according to claim 9,
wherein the control terminal of the second transistor of the receiver circuit is connected to the first terminal of the integrated semiconductor device, and
wherein the output signal of the receiver circuit is transmitted to the memory cell array.

11. The integrated circuit according to claim 9, further comprising an address register for storing a state of the address signal,
wherein the control terminal of the second transistor of the receiver circuit is connected to the second terminal of the integrated semiconductor device, and
wherein the output signal of the receiver circuit is transmitted to the address register.

12. The integrated circuit according to claim 9, comprising:
a control unit for controlling the read access/write access which depends on the state of the control signal,
wherein the control terminal of the second transistor of the receiver circuit is connected to the third terminal of the integrated semiconductor device, and
wherein the output signal of the receiver circuit is transmitted to the control unit.

13. The integrated circuit according to claim 9, wherein each of the memory cells comprises is configured as a random access memory cell.

14. The integrated circuit according to claim 1, wherein the memory device is provided as a memory component of a Dual-In-Line-Memory module.

15. In an integrated circuit comprising a programmable storage unit with a programmable element in which a storage state is storable, and a receiver circuit for receiving a data signal, an address signal, or a control signal, the receiver circuit comprising a first terminal for applying a power supply voltage, a second terminal for applying a reference voltage, a third terminal, a first current path including a first transistor having a control terminal, a second current path including a second transistor having a control terminal, and a controllable resistor, wherein the first current path and the second current path of the receiver circuit are connected in parallel between the first terminal and the third terminal of the receiver circuit, wherein the controllable resistor of the receiver circuit is connected between the third terminal and the second terminal of the receiver circuit, and wherein the first and second transistors respectively are connected to the second terminal for applying the reference voltage via the controllable resistor and wherein the control terminal of the first transistor is actuated by a first signal, the control terminal of the second transistor is actuated by a second signal that is different from the first signal, and the control terminal of the first transistor and the control terminal of the second transistor are separated from each other, a method comprising:
evaluating the storage state of the programmable element of the programmable storage unit; and
adjusting a resistance value of the controllable resistor of the receiver circuit in response to evaluation of a state of the programmable storage unit,
wherein the state of the programmable storage unit indicates one of a high power dissipation or a low power dissipation and the resistance value of the controllable resistor is adjusted to have a first resistance value or a second resistance value that is lower than the first resistance value in response to the state of the programmable storage unit.

16. The method of claim 15, wherein the resistance value is increased in response to a first storage state of the programmable element of the programmable storage unit being evaluated.

17. The method of claim 15, wherein the resistance value is decreased in response to a second storage state of the programmable element of the programmable storage unit being evaluated.

18. A computer system comprising a memory, wherein at least a portion of the memory comprises an integrated memory device, the integrated memory device comprising:
a programmable storage unit for storing a storage state; and
a receiver circuit comprising a first terminal for applying a power supply voltage, a second terminal for applying a reference voltage, a third terminal, a first current path, a second current path and a controllable resistor, wherein:
the first current path of the receiver circuit includes a first transistor having a control terminal and the second current path of the receiver circuit includes a second transistor having a control terminal and the first and second current paths are connected parallel between the first terminal and the third terminal of the receiver circuit;
the controllable resistor of the receiver circuit is connected between the third terminal and the second terminal of the receiver circuit;
a resistance value of the controllable resistor of the receiver circuit is dependent on the storage state, wherein the storage state indicates one of a high power dissipation or a low power dissipation and the resistance value of the controllable resistor is selected to have a first resistance value or a second resistance value that is lower than the first resistance value in response to the storage state; and
the first and second transistors respectively are connected to the second terminal for applying the reference voltage via the controllable resistor,
wherein the control terminal of the first transistor is actuated by a first signal, the control terminal of the second transistor is actuated by a second signal that is different from the first signal, and the control terminal of the first transistor and the control terminal of the second transistor are separated from each other.

* * * * *